United States Patent [19]

Sardella

[11] Patent Number: 5,585,308
[45] Date of Patent: Dec. 17, 1996

[54] METHOD FOR IMPROVED PRE-METAL PLANARIZATION

[75] Inventor: John C. Sardella, Highland Village, Tex.

[73] Assignee: SGS-Thomson Microelectronics, Inc., Carrollton, Tex.

[21] Appl. No.: 411,585

[22] Filed: Mar. 29, 1995

Related U.S. Application Data

[62] Division of Ser. No. 172,487, Dec. 23, 1993, abandoned.
[51] Int. Cl.⁶ ................................................. H01L 21/28
[52] U.S. Cl. ...................... 437/190; 437/192; 437/194; 437/195; 437/228
[58] Field of Search ..................... 437/190, 192, 437/195, 194, 228; 257/751, 752, 763; 216/38

[56] References Cited

U.S. PATENT DOCUMENTS

| | | | |
|---|---|---|---|
| 5,049,975 | 9/1991 | Ajika et al. | 257/764 |
| 5,061,985 | 10/1991 | Meguro et al. | 257/764 |
| 5,124,780 | 6/1992 | Sandhu et al. | 437/190 |
| 5,164,330 | 11/1992 | Davis et al. | 437/190 |
| 5,233,217 | 8/1993 | Dixit et al. | 257/764 |
| 5,356,836 | 10/1994 | Chen et al. | 437/192 |
| 5,486,492 | 1/1996 | Yamamoto et al. | 437/194 |

FOREIGN PATENT DOCUMENTS

| | | |
|---|---|---|
| 62-123769 | 6/1987 | Japan . |
| 01186658 | 7/1989 | Japan . |
| 0322772 | 9/1991 | Japan . |
| 04010572 | 1/1992 | Japan . |
| 04018750 | 1/1992 | Japan . |

OTHER PUBLICATIONS

S. Wolf "Silicon Processing for the VLSI Era, vol. 2", Lattice Press, 1990, p. 128.

Primary Examiner—George Fourson
Assistant Examiner—Thomas G. Bilodeau
Attorney, Agent, or Firm—Theodore E. Galanthay; Robert Groover; Lisa K. Jorgenson

[57] ABSTRACT

A method of forming an integrated circuit wherein a planarization step is been performed before the primary metal deposition step, but after deposition of the adhesion and barrier layers. Thus the adhesion and barrier layers are present on the sidewalls of contact holes, but do not underlie the whole extent of the primary metallization.

35 Claims, 3 Drawing Sheets

METHOD FOR IMPROVED PRE-METAL PLANARIZATION

This is a Division of application Ser. No. 08/172,487, filed Dec. 23, 1993, abandoned.

BACKGROUND AND SUMMARY OF THE INVENTION

The present invention relates to fabrication of patterned metallization in integrated circuits.

The increasing complexity of ULSI circuits has resulted in an increased number of interconnect levels, as well as an increased amount of metal routing in the first metal layer. The patterning of metal is becoming more and more difficult due to the decreasing pitch and the higher topography due to the added layers of interconnect.

One current approach is to planarize the interlevel dielectric before the metal layer is deposited. This can be accomplished by techniques such as chemical-mechanical polishing or nonselective etchback of photoresist or spin-on glass. After the etchback the metal layer is deposited over a more planar surface, which results in a better process window for the metal pattern definition. (The depth of field of high-resolution photolithographic imaging systems is so small that the magnitude of topographic excursions produced by a patterned layer or two can significantly degrade imaging precision.)

The disclosed innovations provide a new twist on such approaches: planarization is now performed in the middle of the metal deposition process.

Modern metallization systems commonly use an adhesion layer and/or a barrier metal in the contact holes. For example, titanium (Ti) is commonly deposited first, as an adhesion layer, followed by titanium nitride (TiN) to provide a diffusion barrier. (Titanium has very good adhesion to silicon oxides.) A rapid thermal anneal (RTA) converts part of the titanium, where it is in contact with silicon, into titanium silicide (which helps to reduce contact resistance, and to prevent diffusion of titanium into the silicon). The majority of the thickness of the conductor (e.g. Al:Si or Al:Cu) is then deposited, followed by a stack etch in which the barrier and adhesion layers are etched along with the main metal layer.

The proposed method performs planarization AFTER the barrier metal has already been deposited. This process planarizes the interlevel dielectric, and removes the barrier metal from the higher areas of topography (where it is not as necessary). This planarization can be done either by chemical-mechanical polishing or by SOG or resist etchback. The resist etchback method is probably safer, since the photoresist will protect the barrier in the contact holes and is easily removed after the etch is done. After the planarization process is complete, the metal is then deposited in the normal fashion, and processing proceeds normally.

According to a disclosed class of innovative embodiments, there is provided: A method for fabricating integrated circuits, comprising the steps of: providing a partially fabricated structure which includes transistors; depositing an interlevel dielectric layer over said transistors; etching contact holes into said interlevel dielectric layer, to expose portions of said transistors for electrical connection; depositing a first conductive layer over said interlevel dielectric layer, and on the bottoms of said contact holes; conformally depositing a sacrificial material overall, and nonselectively etching away all of said sacrificial except in said contact holes; said etch being continued for long enough to completely remove said first conductive layer from at least some portions of said interlevel dielectric; and depositing an additional layer of metal overall, and patterning said metal to form desired electrical interconnections among said transistors.

According to another disclosed class of innovative embodiments, there is provided: A method for fabricating integrated circuits, comprising the steps of: providing a partially fabricated structure which includes transistors; depositing an interlevel dielectric layer over said transistors; etching contact holes into said interlevel dielectric layer, to expose portions of said transistors for electrical connection; depositing first and second conductive layers over said interlevel dielectric layer, and on the bottoms of said contact holes; performing planarization to a depth sufficient to completely remove said first conductive layer from at least some portions of said interlevel dielectric; and depositing an additional layer of metal overall, and patterning said metal to form desired electrical interconnections among said transistors.

According to another disclosed class of innovative embodiments, there is provided: A method for fabricating integrated circuits, comprising the steps of: providing a partially fabricated structure which includes transistors; depositing an interlevel dielectric layer over said transistors; etching contact holes into said interlevel dielectric layer, to expose portions of said transistors for electrical connection; depositing a first conductive layer over said interlevel dielectric layer, and on the bottoms of said contact holes; performing planarization to a depth sufficient to completely remove said first conductive layer from at least some portions of said interlevel dielectric; and depositing an additional layer of metal overall, and patterning said metal to form desired electrical interconnections among said transistors.

According to another disclosed class of innovative embodiments, there is provided: An integrated circuit, comprising: a substrate including at least one monolithic body of semiconductor material, and transistors formed therein; an interlevel dielectric layer overlying said transistors; contact holes extending through said interlevel dielectric layer; a diffusion barrier layer on the bottoms and sidewalls of said contact holes; and a patterned thin-film layer of metal running over said silicon oxynitride layer and extending down into said contact holes, to connect said transistors in a desired electrical configuration; wherein, in at least some locations, said additional metal layer overlies said barrier layer on the top surface of said interlevel dielectric, and in other locations said additional metal layer lies directly on said interlevel dielectric, without said garrier layer therebetween.

BRIEF DESCRIPTION OF THE DRAWING

The present invention will be described with reference to the accompanying drawings, which show important sample embodiments of the invention and which are incorporated in the specification hereof by reference, wherein.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
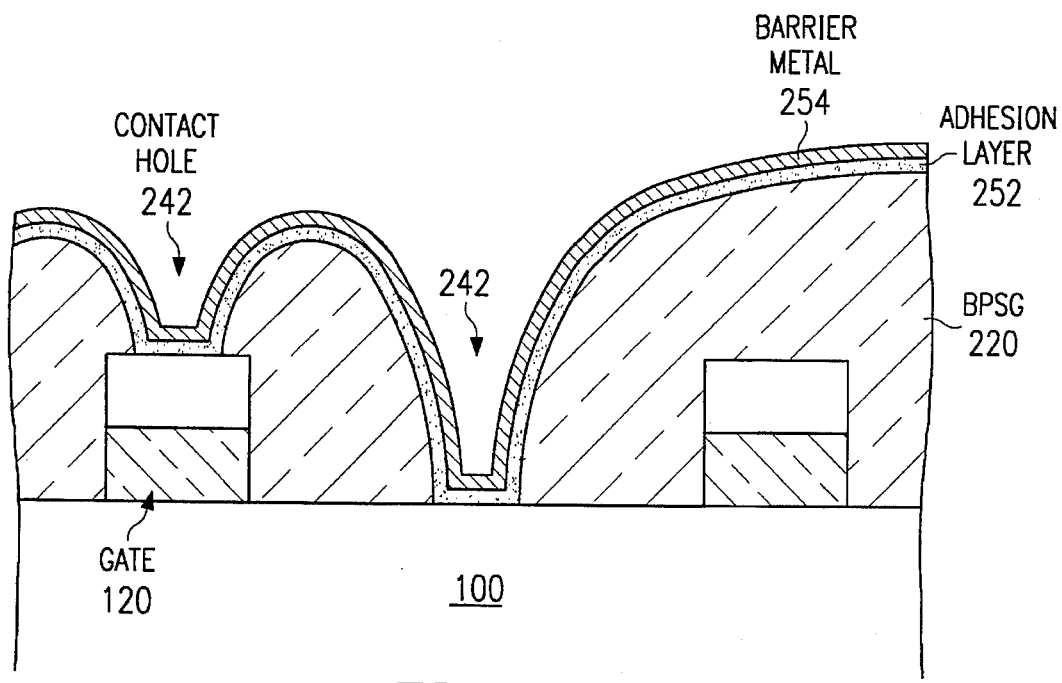
FIGS. 1 and 2 show steps in the fabrication of the metallization layer of an integrated circuit according to conventional processes.

FIG. 1 shows a partially fabricated structure according to a sample embodiment. In this embodiment a monocrystalline silicon substrate 100 includes active device regions (shown) where field oxide is not present. A polycide layer 120 (silicide-clad polysilicon) has been patterned to form transistor gates and interconnects. (Second, third, and fourth layers of polysilicon, with associated interlevel dielectrics, can be added to the process if desired.)

Thereafter an interlevel dielectric 200 is formed, e.g. BPSG (borophosphosilicate glass) over an undoped layer of low-temperature oxide, to a total thickness of e.g. 4000 to 8000 Å, and reflowed if needed. Alternatively, PSG (phosphosilicate glass) or other doped silicate glasses, or other interlevel dielectric materials (including composite multi-layer structures) can be used instead.

Contact holes 242 are now patterned and etched. (The Figure shown includes two contact holes 242, one a contact to poly and one a contact to active. In some processes, the contacts to poly would typically be made where the poly crosses over field oxide.) Another reflow step may now be used to provide sloped sidewalls on the contact holes, or other known methods may be used to reduce the aspect ratio if needed.

The process of forming the metal layer now begins. The adhesion layer 252 and the barrier layer 254 are now deposited. In the presently preferred embodiment, the adhesion layer 252 is formed by sputter deposition of 600 Å of Ti. (Titanium is usually used for the adhesion layer because of its good adhesion to oxide, but alternatively other thicknesses and compositions can be used instead, such as titanium nitride, or even a layered structure, such as Ti/TiN.) The barrier layer 254 is then formed, e.g. by sputter deposition of 1000 Å of TiN. (Titanium nitride is usually used for the barrier layer because of its good adhesion to oxide, but alternatively other thicknesses and compositions can be used instead.)

Rapid thermal annealing is then performed, to induce silicidation in the contact hole. In the presently preferred embodiment, this step uses a radiant cycle of about 30 seconds, to raise the surface temperature to about 650° C.

Figure 2:
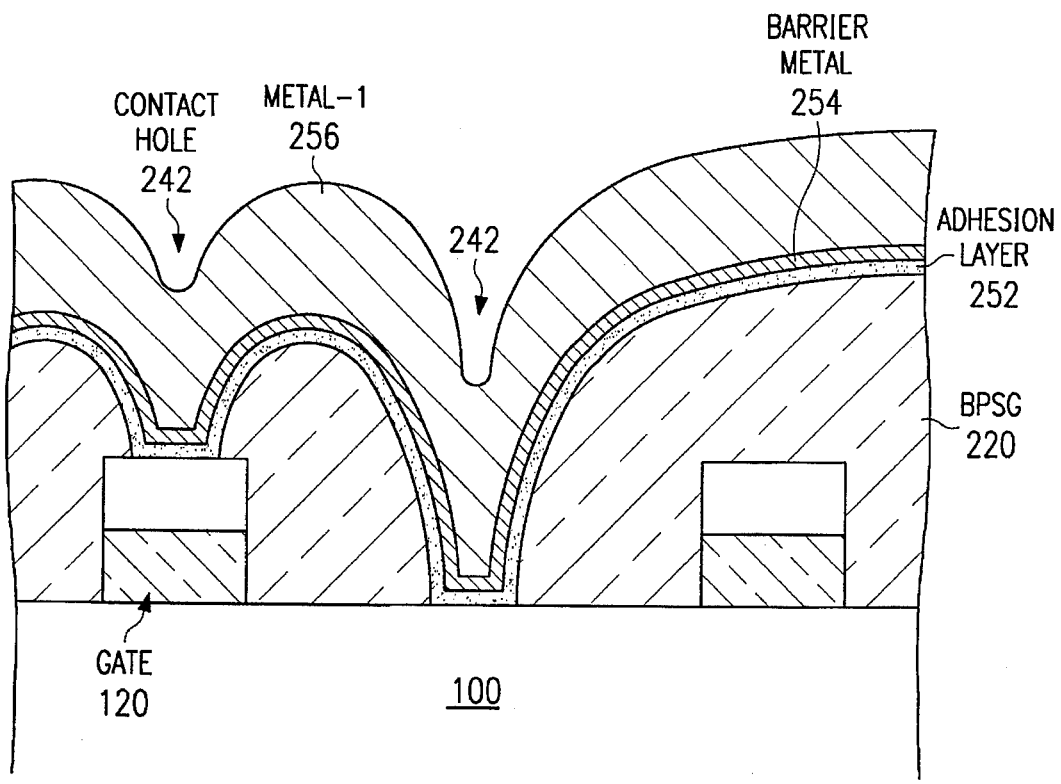

In a conventional process, as shown in FIG. 2, the main thickness of the metal layer (typically but not necessarily an aluminum alloy) is then deposited. This leaves a large amount of topography in the metal layer 256. However, the disclosed inventions introduce a new step at this point.

Figure 3:
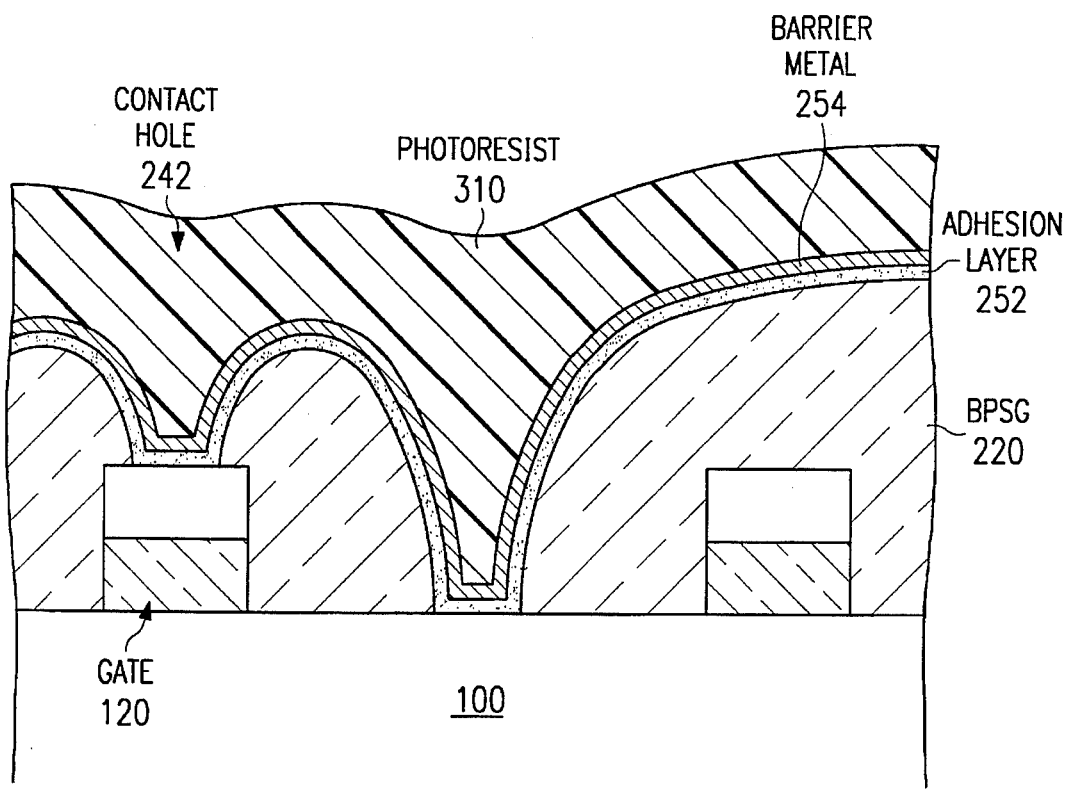
FIGS. 3–5 show a sample of embodiment of steps which can be used, in accordance with the present invention, in fabrication of the metallization layer of an integrated circuit.

According to the innovative teachings disclosed herein, as shown in FIG. 3, a sacrificial layer of photoresist 310 is now deposited overall. In the presently preferred embodiment, the photoresist is coated to a thickness of 1.14 μm.

A global nonselective etchback is now performed, using e.g. a fluoro-etch. (In the presently preferred embodiment, $SF_6+CF_4+NF_3$ is used for this step.) On the high parts of the structure, this etchback step cuts through the resist 310, the barrier and adhesion layers 252/254, and part of the thickness of the interlevel dielectric 220.

A timed etch (16 minutes, in the presently preferred embodiment) is preferably used. The time is preferably calculated to clear the adhesion and barrier layers 252/254, and remove about 2000 Å of BPSG, from the highest points. (The specific time is dependent on the actual etching apparatus used, but can be readily calculated, for any specific apparatus and conditions, from these indications.)

An $O_2$ plasma is then used to remove the resist from the contact holes. The TiN barrier layer is generally resistant to this etch; but if any degradation of contact resistance is found to be caused, a sputter cleanup can optionally be performed before metal deposition.

Figure 4:
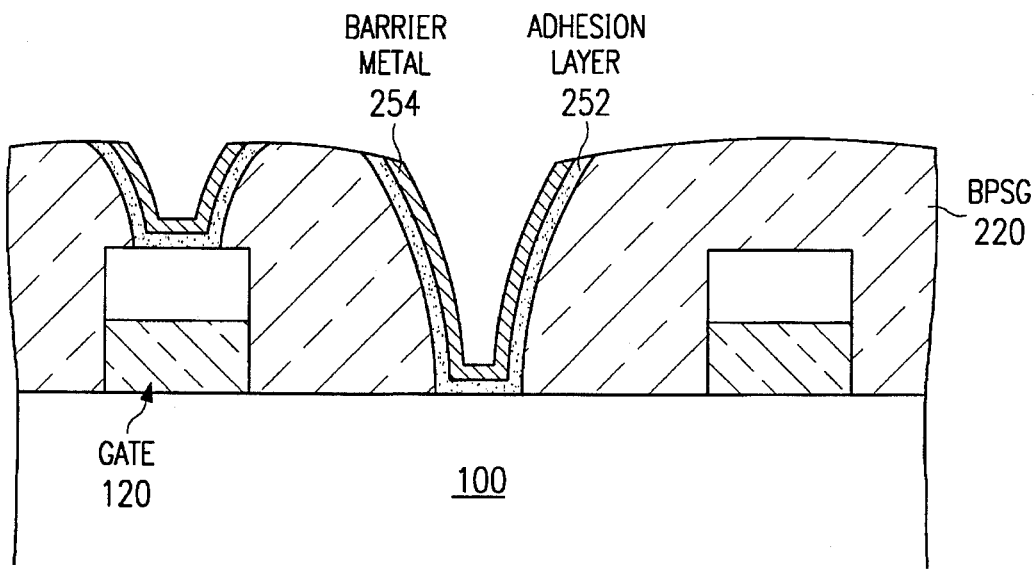
Figure 5:
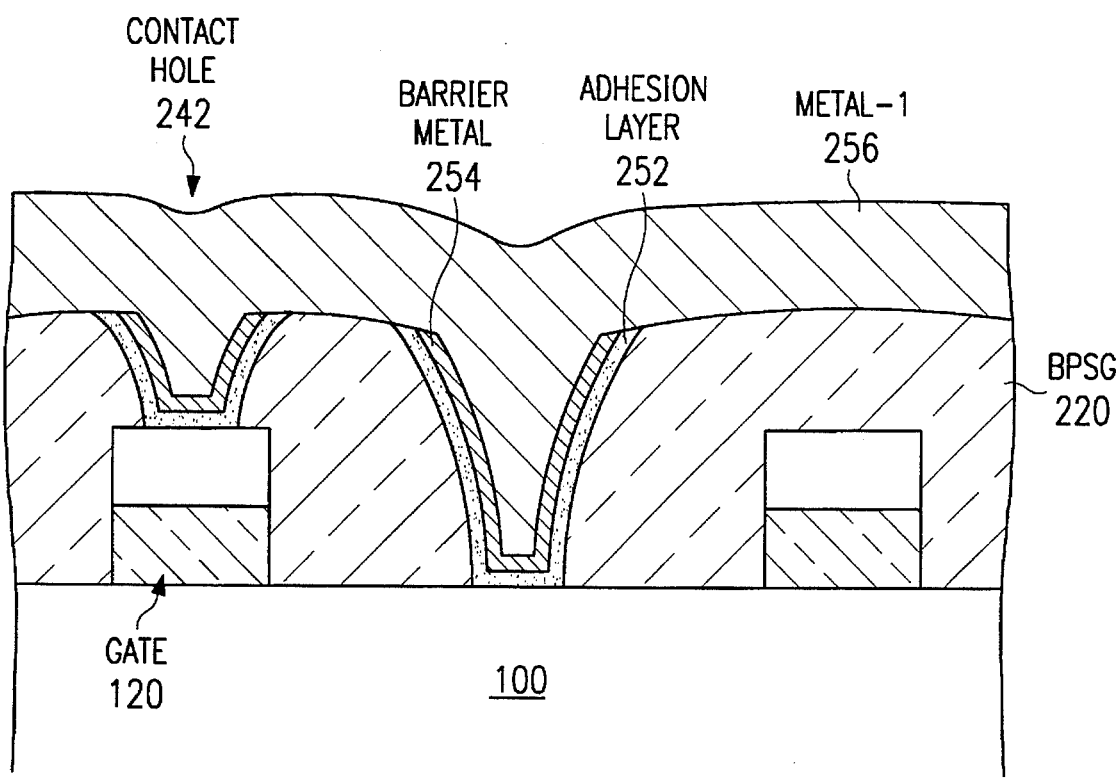

This produces a partially planarized structure as shown in FIG. 4. The main thickness of the metal layer 256' (typically but not necessarily an aluminum alloy, and may even be a multilayer structure) is then deposited. (For example, in the presently preferred embodiment, 6500 Å of Al: 1% Cu: 1% Si is deposited by sputter deposition.) Note that this metal layer 256' will have somewhat less topography than the layer 256 formed according to the prior art. The metal layer 256' is then patterned to achieve the desired circuit configuration.

Processing continues with conventional steps to complete fabrication, e.g. deposition and planarization of further inter-level dielectric, via patterning, second metal deposition and etch, protective overcoat deposition, etching contact pad apertures, etc. etc. See generally, e.g., VLSI TECHNOLOGY (2.ed. Sze 1988); G. Anner, PLANAR PROCESSING PRIMER (1990); R. Castellano; SEMICONDUCTOR DEVICE PROCESSING (1991); W. Runyan & K. Bean, SEMICONDUCTOR INTEGRATED CIRCUIT PROCESSING TECHNOLOGY (1990 ed.); and the annual proceedings of the IEDM conferences; all of which are hereby incorporated by reference.

Advantages

Advantages of the disclosed process innovations include at least the following:

1. Improves planarity by removing the barrier film thickness (which can be more than 1000 Å) before planarizing the underlying oxide (BPSG) layer.
2. Eliminates the barrier corners in contacts which is a spot where cracks can occur. (During deposition of metal into the contact holes, an anomalously thick deposition can sometimes occur at the upper corners of the contact hole. This phenomenon is sometimes referred as "breadloafing," from the shape of the rounded deposits.)
3. Provides improved contact hole aspect ratio.
4. Improves patterning and etching of first and subsequent metal layers, since the metal films will be more planar.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

In one class of alternative embodiments, chemical-mechanical polishing can be substituted for the resist etchback process. However, wafers that have been polished need to be cleaned thoroughly to remove residues from the contact holes.

It should also be noted that the disclosed inventions are not limited to embodiments where both an adhesion layer and a diffusion barrier layer are used. In alternative embodiments, A variety of interlevel dielectrics can be substituted for the undoped oxide and BPSG 220 of the preferred embodiment, including without limitation phosphosilicates, germanosilicates, arsenosilicates or other doped silicate glasses, other inorganic interlevel dielectric materials, and composite multilayer structures of many kinds.

The disclosed process can also be used for via formation, although it may be somewhat less advantageous in that context.

While the inventions have been described with primary reference to a single-poly process, it will be readily recognized that these inventions are equally applicable to double-, triple- or quadruple-poly structures and processes. Similarly, while the contact from first metal to first poly and active has been particularly described, it will be readily recognized that the disclosed inventions are equally applicable to processes with multiple layers of metal.

The innovative process teachings may also be adapted for contact formation in bipolar or other device technologies.

Similarly, it will be readily recognized that the described process steps can also be embedded into hybrid process flows, such as BiCMOS or smart-power processes.

Of course a variety of structures can be used to implement the polysilicon or polycide gate. Similarly, while sidewall spacers are normally used, they are not strictly necessary to the practice of the invention.

Similarly, a wide variety of materials, and of combinations of materials, can be used to implement the metal layer.

Of course, the specific etch chemistries, layer compositions, and layer thicknesses given are merely illustrative, and do not by any means delimit the scope of the claimed inventions.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. A method for fabricating integrated circuits, comprising the steps of:
   (a.) providing a partially fabricated structure which includes transistors;
   (b.) depositing an interlevel dielectric layer over said transistors;
   (c.) etching contact holes into said interlevel dielectric layer, to expose portions of said transistors for electrical connection;
   (d.) depositing a first conductive layer over said interlevel dielectric layer, and on the bottoms of said contact holes;
   (e.) depositing a planar sacrificial material, and nonselectively etching away all of said sacrificial material except in said contact holes; said etch being continued for long enough to completely remove said first conductive layer from, and to planarize, at least some portions of said interlevel dielectric; and thereafter selectively etching away said sacrificial material from said contact holes; and
   (f.) depositing an additional layer of metal, which is thicker than said first conductive layer, and patterning said metal to form electrical interconnections among said transistors.

2. The method of claim 1, wherein said first conductive layer comprises titanium nitride.

3. The method of claim 1, wherein said interlevel dielectric comprises a doped silicate glass over an undoped silicate glass.

4. The method of claim 1, wherein said interlevel dielectric comprises borophosphosilicate glass.

5. The method of claim 1, wherein said additional metal layer is deposited to a thickness in the range between about 3000 Å and about 8000 Å inclusive.

6. The method of claim 1, wherein said additional metal layer consists of an alloy of aluminum.

7. The method of claim 1, wherein said additional metal layer comprises an alloy of aluminum over a second conductive layer comprising at least 40% by weight of titanium.

8. The method of claim 1, wherein said additional metal layer comprises a multilayer structure.

9. The method of claim 1, wherein said interlevel dielectric has a total thickness in the range of 3000–10,000 Å inclusive.

10. The method of claim 1, wherein said first conductive layer is deposited uniformly on the bottoms and sidewalls of said contact holes.

11. A method for fabricating integrated circuits, comprising the steps of:
   (a.) providing a partially fabricated structure which includes transistors;
   (b.) depositing an interlevel dielectric layer over said transistors;
   (c.) etching contact holes into said interlevel dielectric layer, to expose portions of said transistors for electrical connection;
   (d.) depositing first and second conductive layers over said interlevel dielectric layer, and on the bottoms of said contact holes;
   (e.) performing planarization by depositing a planar sacrificial material and non-selectively etching to a depth sufficient to completely remove said first conductive layer from at least some portions of said interlevel dielectric and to remove at least some portions of said interlevel dielectric;
   (f.) selectively etching away said sacrificial material from said contact holes; and
   (g.) depositing an additional layer of metal, which is thicker than said first and said second conductive layers, and patterning said metal to form electrical interconnections among said transistors.

12. The method of claim 11, wherein said first conductive layer comprises titanium nitride.

13. The method of claim 11, wherein said first conductive layer comprises metallic titanium, and said second conductive layer comprises titanium nitride.

14. The method of claim 11, wherein said first and second conductive layers are deposited uniformly on the bottoms and sidewalls of said contact holes.

15. The method of claim 11, wherein said first conductive layer comprises a layered structure.

16. The method of claim 11, wherein said first conductive layer comprises a Ti/TiN layered structure.

17. The method of claim 11, wherein said interlevel dielectric comprises a doped silicate glass over an undoped silicate glass.

18. The method of claim 11, wherein said interlevel dielectric comprises borophosphosilicate glass.

19. The method of claim 11, wherein said additional metal layer is deposited to a thickness in the range between about 3000 Å and about 8000 Å inclusive.

20. The method of claim 11, wherein said additional metal layer consists of an alloy of aluminum.

21. The method of claim 11, wherein said additional metal layer comprises an alloy of aluminum over said second conductive layer, which comprises at least 40 atomic weight % of titanium.

22. The method of claim 11, wherein said additional metal layer comprises a multilayer structure.

23. The method of claim 11, wherein said interlevel dielectric has a total thickness in the range of 3000–10,000 Å inclusive.

24. A method for fabricating integrated circuits, comprising the steps of:

(a.) providing a partially fabricated structure which includes transistors;

(b.) depositing an interlevel dielectric layer over said transistors;

(c.) etching contact holes into said interlevel dielectric layer, to expose portions of said transistors for electrical connection;

(d.) depositing a first conductive layer over said interlevel dielectric layer, and on the bottoms of said contact holes;

(e.) performing planarization to a depth sufficient to completely remove said first conductive layer from at least some portions of said interlevel dielectric and to remove at least some portions of said interlevel dielectric;

(f.) after the planarization step, depositing and patterning an additional layer of metal, which is thicker than said first conductive layer, to fill said holes and to form electrical interconnections among said transistors.

25. The method of claim 24, wherein said first conductive layer comprises titanium nitride.

26. The method of claim 24, wherein said first conductive layer comprises a layered structure.

27. The method of claim 24, wherein said first conductive layer comprises a Ti/TiN layered structure.

28. The method of claim 24, wherein said interlevel dielectric comprises a doped silicate glass over an undoped silicate glass.

29. The method of claim 24, wherein said interlevel dielectric comprises borophosphosilicate glass.

30. The method of claim 24, wherein said additional metal layer is deposited to a thickness in the range between about 3000 Å and about 8000 Å inclusive.

31. The method of claim 24, wherein said additional metal layer consists of an alloy of aluminum.

32. The method of claim 24, wherein said additional metal layer comprises an alloy of aluminum over a second conductive layer comprising at least 40 atomic weight % of titanium.

33. The method of claim 24, wherein said additional metal layer comprises a multilayer structure.

34. The method of claim 24, wherein said interlevel dielectric has a total thickness in the range of 3000–10,000 Å inclusive.

35. The method of claim 34, wherein said first conductive layer is deposited uniformly on the bottoms and sidewalls of said contact holes.

* * * * *